US007277902B2

(12) United States Patent
Park et al.

(10) Patent No.: US 7,277,902 B2
(45) Date of Patent: Oct. 2, 2007

(54) METHOD AND APPARATUS FOR COMPARING AND SYNCHRONIZING PROGRAMMABLE LOGIC DEVICE USER CONFIGURATION DATASET VERSIONS

(75) Inventors: Jim Park, San Jose, CA (US); Mihail Iotov, San Jose, CA (US); Michael V. Wenzler, Oakland, CA (US)

(73) Assignee: Altera Corporation, San Jose, CA (US)

(*) Notice: Subject to any disclaimer, the term of this patent is extended or adjusted under 35 U.S.C. 154(b) by 346 days.

(21) Appl. No.: 11/108,370

(22) Filed: Apr. 18, 2005

(65) Prior Publication Data

US 2006/0236293 A1 Oct. 19, 2006

(51) Int. Cl.
*G06F 12/00* (2006.01)
(52) U.S. Cl. .................. 707/203; 707/205; 716/17
(58) Field of Classification Search ............. 716/17; 707/203, 205
See application file for complete search history.

(56) References Cited

U.S. PATENT DOCUMENTS 6,760,888 B2 * 7/2004 Killian et al. .................. 716/1
7,020,854 B2 * 3/2006 Killian et al. .................. 716/1
2005/0144202 A1 * 6/2005 Chen ........................... 707/205

* cited by examiner

Primary Examiner—Vibol Tan
(74) Attorney, Agent, or Firm—Ropes & Gray LLP; Jeffrey H. Ingerman

(57) ABSTRACT

A graphical tool assists a user in migrating programming changes from one programmable logic device to another. The tool preferably compares a new user configuration dataset (e.g., the user configuration dataset including old features as well as newly-added features) for the "origin" programmable logic device to the existing user configuration dataset (i.e., the user configuration dataset including only old features) for a "destination" programmable logic device, and displays differences to the user. The tool preferably also assists the user to synchronize the devices by "copying" the new features of the user configuration dataset for one device into the old user configuration dataset for another device to the extent possible, by providing graphical inputs to allow the user to indicate which features should be synchronized, or to graphically manipulate the feature assignments directly.

39 Claims, 5 Drawing Sheets

METHOD AND APPARATUS FOR COMPARING AND SYNCHRONIZING PROGRAMMABLE LOGIC DEVICE USER CONFIGURATION DATASET VERSIONS

BACKGROUND OF THE INVENTION

This invention relates to the comparison and synchronization of programmable logic device user configuration dataset versions. More particularly, this invention relates to the comparison and synchronization of user configuration dataset versions whether for identical programmable logic devices, different devices in the same family, or different types of devices.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements each time that the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices have been provided. With mask-programmable logic devices, instead of selling all users the same device, the manufacturer manufactures a partial device with a standardized arrangement of logic elements whose functions are not programmable by the user, and which lacks any routing or interconnect resources.

The user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

Although with the simplest early programmable logic devices, it may have been possible to lay out a logic design by hand, it has been traditional to use software tools provided by the programmable logic device manufacturer or by third parties to program programmable logic devices. Contemporary programmable logic devices have become so complex that programming a device without such software tools is at best impractical.

The number of different programmable logic devices has proliferated. A single manufacturer might provide several different types of devices, and within a type several families of devices, and within a family several devices of different sizes having more or fewer features. A user may want to incorporate different programmable logic devices into different products or uses, but perform similar functions. Thus, a manufacturer of cellular telephones may provide telephone models of different prices and feature complexity. Among the components of such telephones may be programmed programmable logic devices. The telephone manufacturer's different models, having different prices, may incorporate different models of programmable logic devices that reflect the prices and features sets of the telephones. Nevertheless, for certain features, the telephone manufacturer may have proven certain programmable logic device programming and would like to use that programming in all of its telephones to the extent possible.

There may be other reasons why a user would want to use different versions of the same programming. For example, a user may have a working design for a particular programmable logic device, but may prototype additional features in a test program for the same programmable logic device. Once that test program has been proven, the user will want to migrate those features into the existing design. Or the user might want to optimize settings of the programming tool, without making any actual logical changes, to see if the programming tool can be made to provide a more efficient programming file.

Alternatively, a user may want to copy a design from a more complex programmable logic device into a smaller programmable logic device of the same family, to use, e.g., in a less expensive version of the same product. Or the user may want to migrate the design to a completely different programmable logic device family. For example, for cost reduction, the user may want to shift some of its production into mask-programmable devices. Certain mask-programmable devices are virtually identical to the conventional programmable logic devices to which they correspond, while others, such as that described in copending, commonly-assigned U.S. patent application Ser. No. 10/316,237, filed Dec. 9, 2002 and hereby incorporated herein by reference in its entirety, includes a plurality of more elementary logic areas that can be connected together to provide the functionality of a corresponding conventional programmable logic device. Either way, there will be differences (fewer or more, respectively) between the programming for a conventional programmable logic device and a corresponding mask-programmable logic device.

The user programming for each of these devices may be stored in one or both of (a) a file, such as a hardware description language file, describing the logical behavior of the device, and (b) a file of settings for the programming tool. The combination of one or both of those files will be referred to herein, and in the claims that follow, as a "user configuration dataset." Once a user has created the different user configuration datasets embodying programming for the different devices, the user ordinarily will want to be able to make changes in the user configuration dataset of one device, and migrate that change to the user configuration datasets of other devices. However, differences between device families, and even within families, may make such migration less than straightforward.

It would be desirable to be able migrate user configuration dataset changes among different programmable logic devices.

SUMMARY OF THE INVENTION

The present invention provides a tool to assist a user in migrating user configuration dataset changes from one programmable logic device to another. The tool, which may include a method and/or apparatus for performing the method, preferably compares the new user configuration dataset (e.g., the user configuration dataset including old features as well as newly-added features) for the "origin" programmable logic device to the existing user configuration dataset (i.e., the user configuration dataset including only old features) for a "destination" programmable logic device, displays differences to the user, and preferably assists the user to "copy" the new features into the old user configuration dataset to the extent possible.

In a simple case, the destination device may be the same as the origin device and there the copying step can be a true copying step with no decision-making or outside intervention required. At a somewhat higher level of complexity, the destination device may be a device of a different size in the same family of devices. If the destination device is larger than the origin device, this is usually like the previous case where the revised design is simply copied. If the destination device is smaller than the origin device, it may be found that not all changes can be copied. For example, the change may require the use of hard multipliers provided on the programmable logic device, and a smaller model in the same family may not have enough hard multipliers on board. Or it may be that certain user constraints—such as that certain logic be "locked" in a certain arrangement in a certain area of the device—cannot be accommodated in the destination device even though the design otherwise can be accommodated, including the functionality of the area desired, but unable, to be locked.

One of the more complex cases would be that where the destination device is in a completely different family than the origin device. An example of this is where the origin device is a conventional programmable logic device while the destination device is a mask-programmable logic device. In such a case, as well as in the case of two different families of conventional programmable logic devices, the differences in devices are likely to give rise to the greatest difficulty in migrating a user configuration dataset change.

Preferably, in accordance with the present invention, if a user configuration dataset change for an origin programmable logic device cannot simply be copied to the user configuration dataset of a destination programmable logic device, the tool according to the invention may take a tiered approach to the problem. Thus, for simple mismatches, the tool preferably has access to a database of rules that allows it to change the origin user configuration dataset to a user configuration dataset that is compatible with the destination programmable logic device. The tool could simply implement the change to copy the user configuration dataset revisions to the destination user configuration dataset, or could preview the change for the user and give the user a chance to accept, reject or alter the changes. Or the tool may ask the user to make a change of the user's own choosing. For more complex mismatches, the tool preferably does not make any changes without prompting the user for input or approval. In the most complex mismatches, the tool may be unable to suggest a change, and may simply flag the difference and request that the user deal with it.

The invention preferably includes a graphical user interface for presentation of user configuration dataset mismatches between the revised origin user configuration dataset and the destination user configuration dataset, and for presenting proposed changes (and seeking approval), or for asking for user input to resolve a mismatch for which the tool does not make a suggestion.

In one preferred embodiment, the tool presents the origin and destination user configuration datasets in the form of a list of elements similar to device netlist, with elements that agree in one color, and elements that disagree in another color. For the elements that disagree, the graphical interface may allow elements to be dragged by the user from one revision to the other to make them agree or otherwise may offer the user the opportunity to input required changes, or the system can present suggested changes and offer the user a graphical acceptance option, such as clicking a check box. Alternatively, in the initial display, the interface may simply allow the user to indicate, again with, e.g., a check box, whether an element that differs needs to be synchronized at all (the user may intend them to differ), and at a second step may allow those for which synchronization was indicated to be synchronized using, e.g., the drag-and-drop, input or check-box methods described above.

In more complicated cases, the tool may be unable to determine whether or not a change can or should be made and may simply ask the user for input. For example, a dialog box may pop up indicating the problem to be solved and inviting entry of a solution.

The tool may have sufficient information in its database to "know" that certain elements cannot be changed (whether or not they appear to agree). For example, a mask-programmable logic device may present certain restrictions. In such cases, the elements that cannot be changed may be presented differently (e.g., may be "grayed out") from other elements.

Thus, in accordance with the present invention there is provided a method for comparing an origin programmable logic device user configuration dataset for a first programmable logic device to a destination programmable logic device user configuration dataset for a second programmable logic device, where the origin programmable logic device user configuration dataset is a revision of a first programmable logic device user configuration dataset and the first and destination programmable logic device programs have similar functionality, for determining whether the destination programmable logic device user configuration dataset can be synchronized with the revision. The method includes determining an element of the origin programmable logic device user configuration dataset that differs from an element of the destination programmable logic device user configuration dataset, querying a database of features of the first and second programmable logic devices, applying information regarding those features to any element that differs, and displaying to a user at least one of (a) said element of said destination programmable logic device user configuration dataset that differs from said origin programmable logic device user configuration dataset, and (b) elements of said destination programmable logic device user configuration dataset that do not differ from said origin programmable logic device user configuration dataset. The method further provides for changing any element that differs.

Apparatus for the performing the method is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-4.

Figure 1:
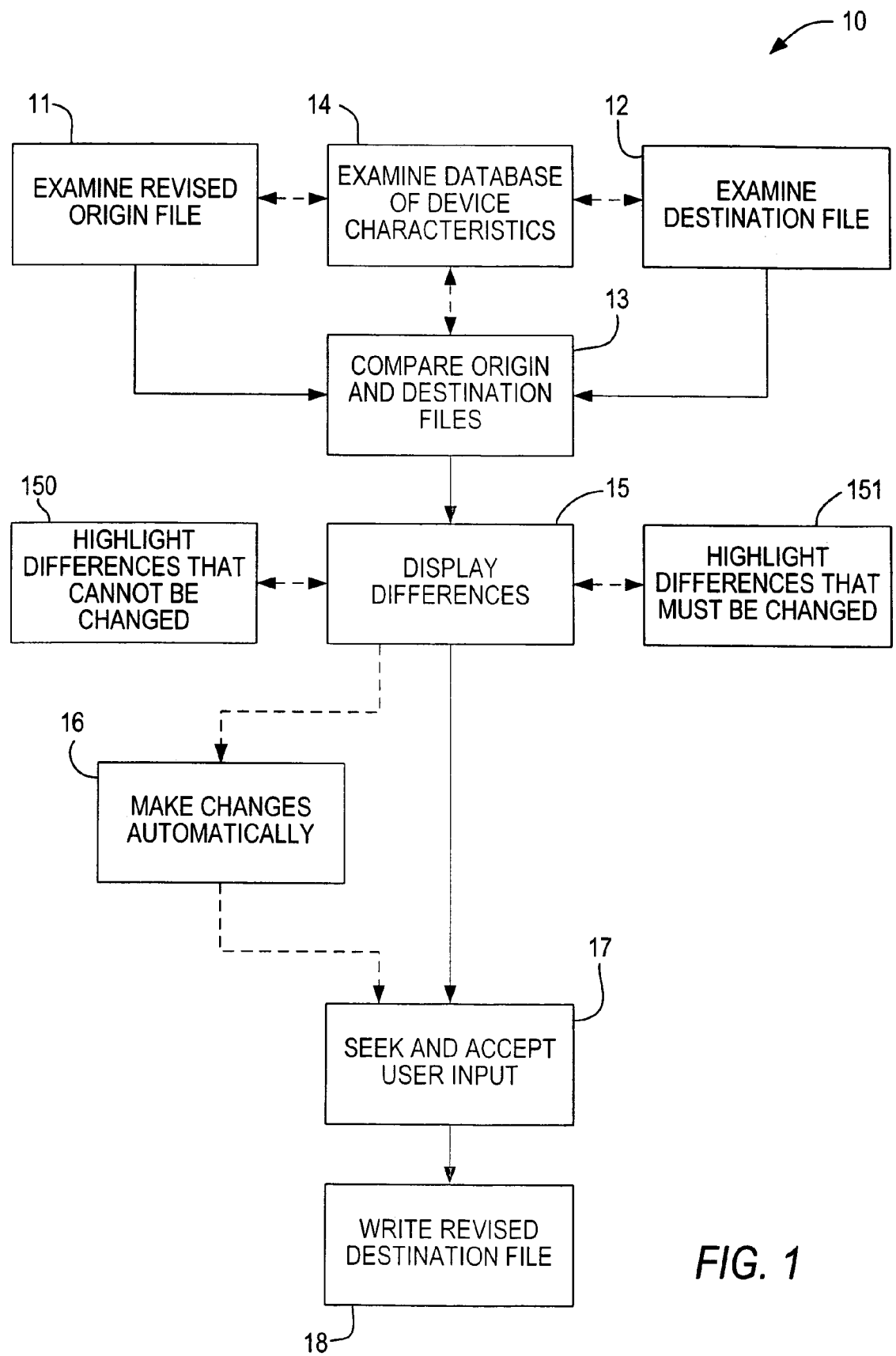
FIG. 1 is a flow diagram of a preferred embodiment of a method according to the present invention.
Figure 2:
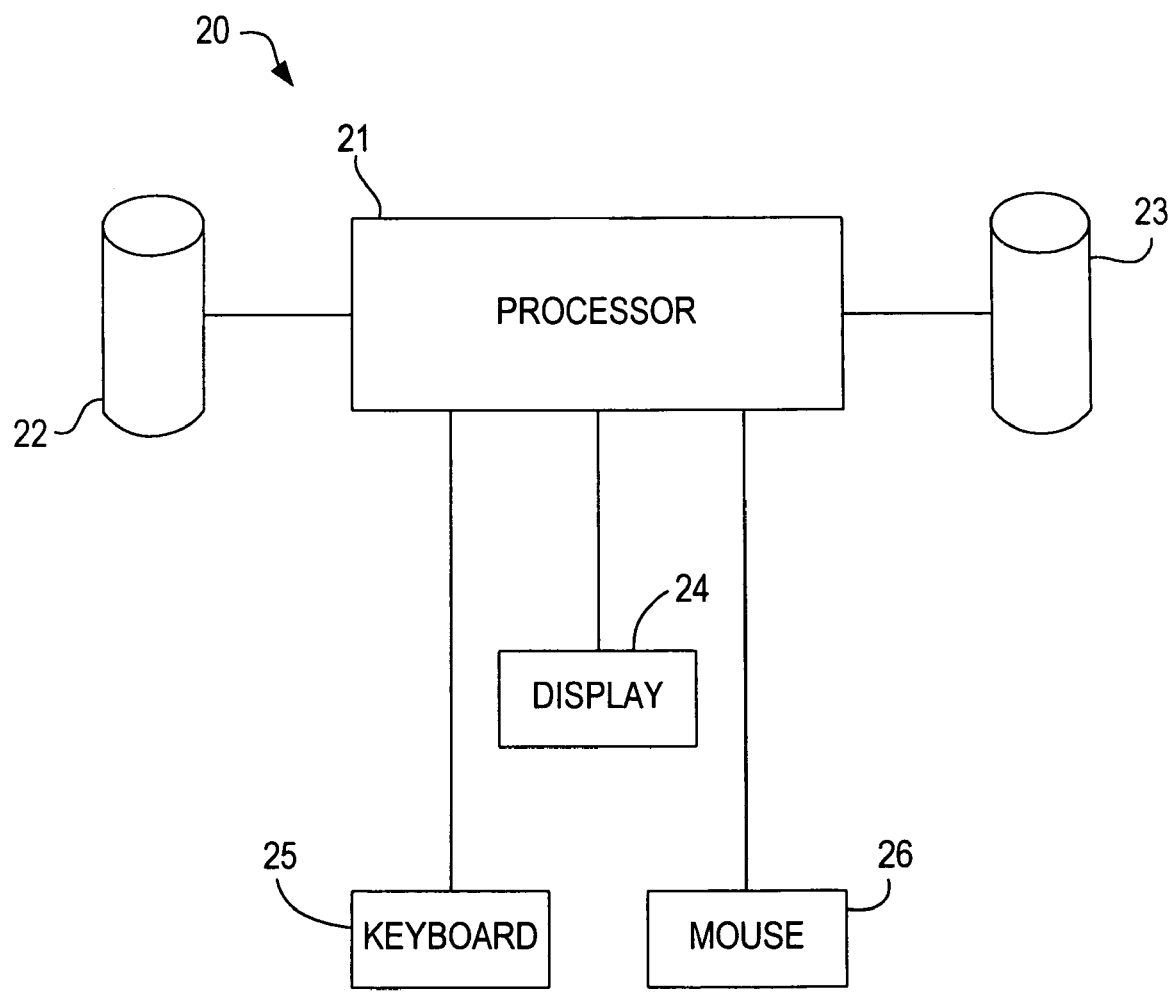
FIG. 2 is a schematic diagram of a preferred embodiment of apparatus according to the present invention for performing the method of FIG. 1.

FIG. 1 shows a preferred embodiment of a method 10 in accordance with the present invention, while FIG. 2 is a schematic diagram of apparatus 20 on which method 10 may be performed. Thus, processor 21 preferably at step 11 reads an origin file, representing a programmable logic device design that is appropriate for a first type of programmable logic user configuration dataset and that has been revised by a user, from storage device 22, which may be a conventional hard disk drive or any other suitable storage technology, and at step 12 reads a destination file, representing a programmable logic device user configuration dataset that is appropriate for a second type of programmable logic device. Steps 11 and 12 could be carried out serially or substantially simultaneously. At step 13, the origin and destination files are compared.

The purpose of method 10 is, at least, to identify to the user differences between the revised origin file and the destination file, so that changes can be made to the destination file to keep it synchronized with the origin file, so that a programmable logic device programmed by the destination file will operate substantially identically to a programmable logic device programmed by the origin file. As explained above, those devices could be devices of different sizes in the same family or devices in different families. The devices of different families could include a mask-programmable device and a corresponding conventional programmable logic device (such as an FPGA). Accordingly, when examining the origin and destination files in steps 11 and 12, and during the comparison at step 13, a separate database 23 of characteristics of the devices programmed by the respective files preferably also is examined (at 14), so that it can be determined whether an apparent programming difference is merely a text difference between the files that does not give rise to an actual programming difference, or is an actual difference to be displayed to the user.

Another possibility is that the differences are real differences, but arise from differences between the devices for which the programming files are written. Thus, the origin file may be for a relatively large device and may include a lock indication signifying that certain logic should be implemented together and in a particular location on the device. The destination file may be for a smaller device, where that sort of lock cannot be honored, but nevertheless the functionality can be preserved with a different layout. Thus, the origin and destination files will differ in that respect, but by reference to database 23 it can be determined that those differences are not in fact differences.

Differences that are determined actually to be differences preferably are displayed to the user on display 24 at step 15. Examples of different display formats are discussed below. Preferably, the display includes an option for the user to indicate that the differences should be synchronized, or to indicate on a difference-by-difference basis whether or not differences should be synchronized. However, certain differences may result from difference between the devices for which the different files are written, and cannot be synchronized. Preferably, during display step 15, those differences are highlighted as at 150. For example, they may be "grayed out" on the display so that the user cannot make changes. Similarly, there may be certain differences, particularly between a programming file for a conventional programmable logic device and a programming file for a mask-programmable logic device, where the user cannot be allowed to leave differences unsynchronized. Such differences preferably also are highlighted during display step 15, as at 151. For example, such changes may appear in a color, such as red, that warns the user that changes to synchronize those differences are mandatory.

After receiving user input—e.g., via keyboard 25 or mouse 26—the system preferably proceeds optionally to step 16 where it attempts to automatically synchronize all differences, seeking further user input at step 17 in those cases where it cannot determine the correct synchronization on its own. The input sought at step 17 may be to approve a suggestion by the system or, where the system is unable even to make a suggestion, to have the user input the correct synchronization. Alternatively, the system may proceed directly from step 15 to step 17, seeking user input for every synchronization. After all of the changes needed for synchronization are determined, the synchronized destination file is written at step 18 to storage 22.

Figure 3:
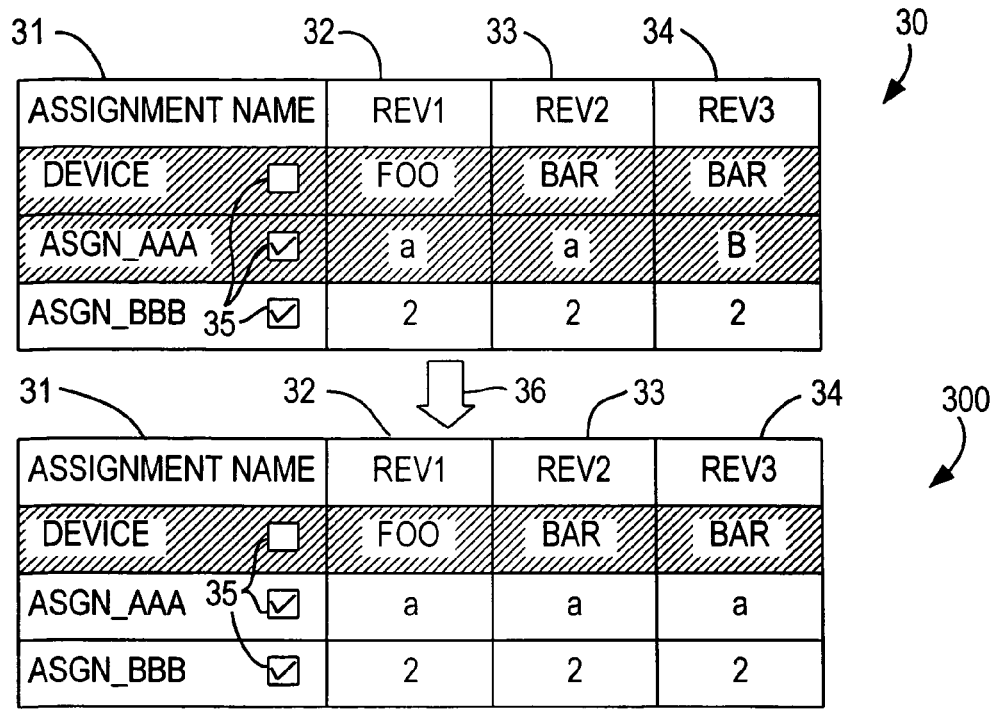
FIG. 3 is an exemplary screen display according to a first preferred embodiment of the present invention.

FIG. 3 shows one example of a possible display 30 of differences. Display 30 preferably takes the form of a table in which the first column 31 identifies a logical assignment, and the second, third and fourth columns 32, 33, 34 indicate assignment values for three different revisions (identified as rev1, rev2 and rev3). Although the discussion to this point has referred to two revisions, the system may have access to other revisions as well. Thus, one revision may be for yet a different device. Or the system may display not only the origin file for a particular device as recently changed by the user (and giving rise to the need for synchronization) but also the unchanged version for that device.

In display 30, a row may be in one color (signified in FIG. 3 by lack of cross-hatching) where the assignments are synchronized, and in another color (signified in FIG. 3 by cross-hatching) where the assignments are not synchronized. In this embodiment, each row preferably is provided with a check-box 35 that the user can check (e.g., using mouse 26) to indicate that that assignment should be synchronized.

Thus, in FIG. 3, the user has indicated that assignment ASGN_AAA (which is not synchronized) and assignment ASGN_BBB (which is already synchronized) should be synchronized. After making those selections, the user may initiate the synchronization process (e.g., by clicking on a button that is not shown). The result of the synchronization process (indicated by arrow 36) is shown in FIG. 3 as display 300, where ASGN_AAA, which was not synchronized and which was checked by the user, is now synchronized across all revisions. The assignment DEVICE, which also was not synchronized in display 30 but was not checked by the user, remains unsynchronized in display 300. ASGN_BBB remains synchronized. Although ASGN_BBB was already synchronized in display 30, checking box 35 for ASGN_BBB indicated to the system that it could not break synchronization of that assignment while synchronizing other assignments.

It should be noted that the process indicated by arrow 36 could include the seeking of input from the user, as discussed above, via dialog boxes (not shown) or other suitable displays.

Figure 4:
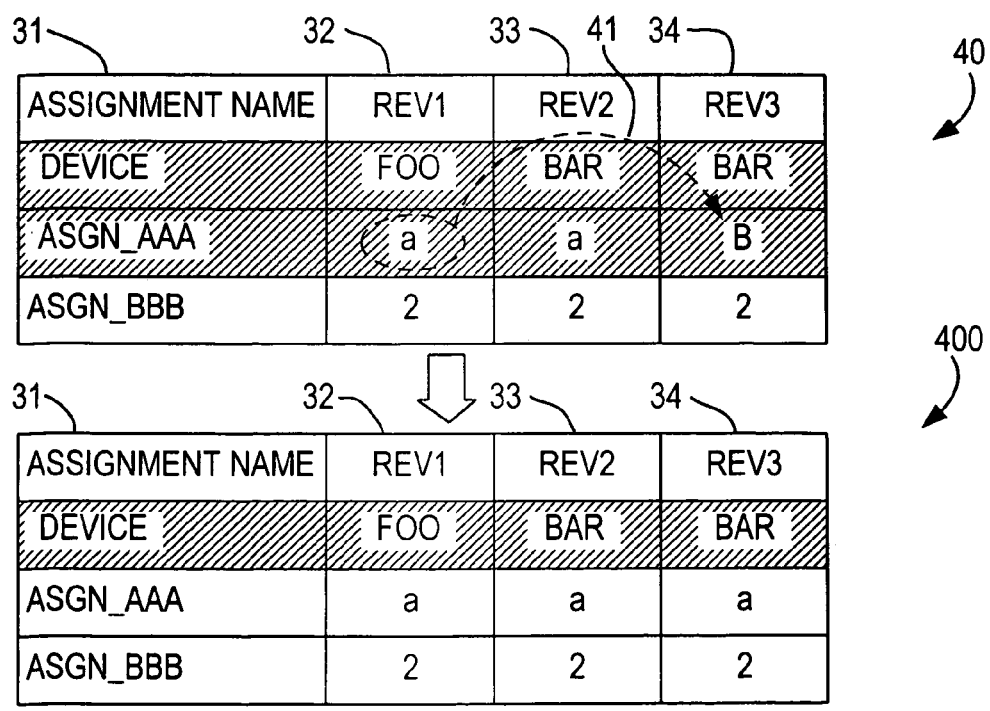
FIG. 4 is an exemplary screen display according to a second preferred embodiment of the present invention.

FIG. 4 shows another preferred embodiment of a display 40. Display 40 has the same tabular and color arrangement as display 30 but lacks check-boxes 35. Instead, display 40 is interactive, allowing the user to synchronize assignments by dragging assignment values from one column to another as indicated by arrow 41. The result, shown as display 400, is identical to display 300.

Thus it is seen that a tool that conveniently displays differences among different user configuration dataset files, allowing easy synchronization, and therefore easy migration among different devices, has been provided.

Figure 5:
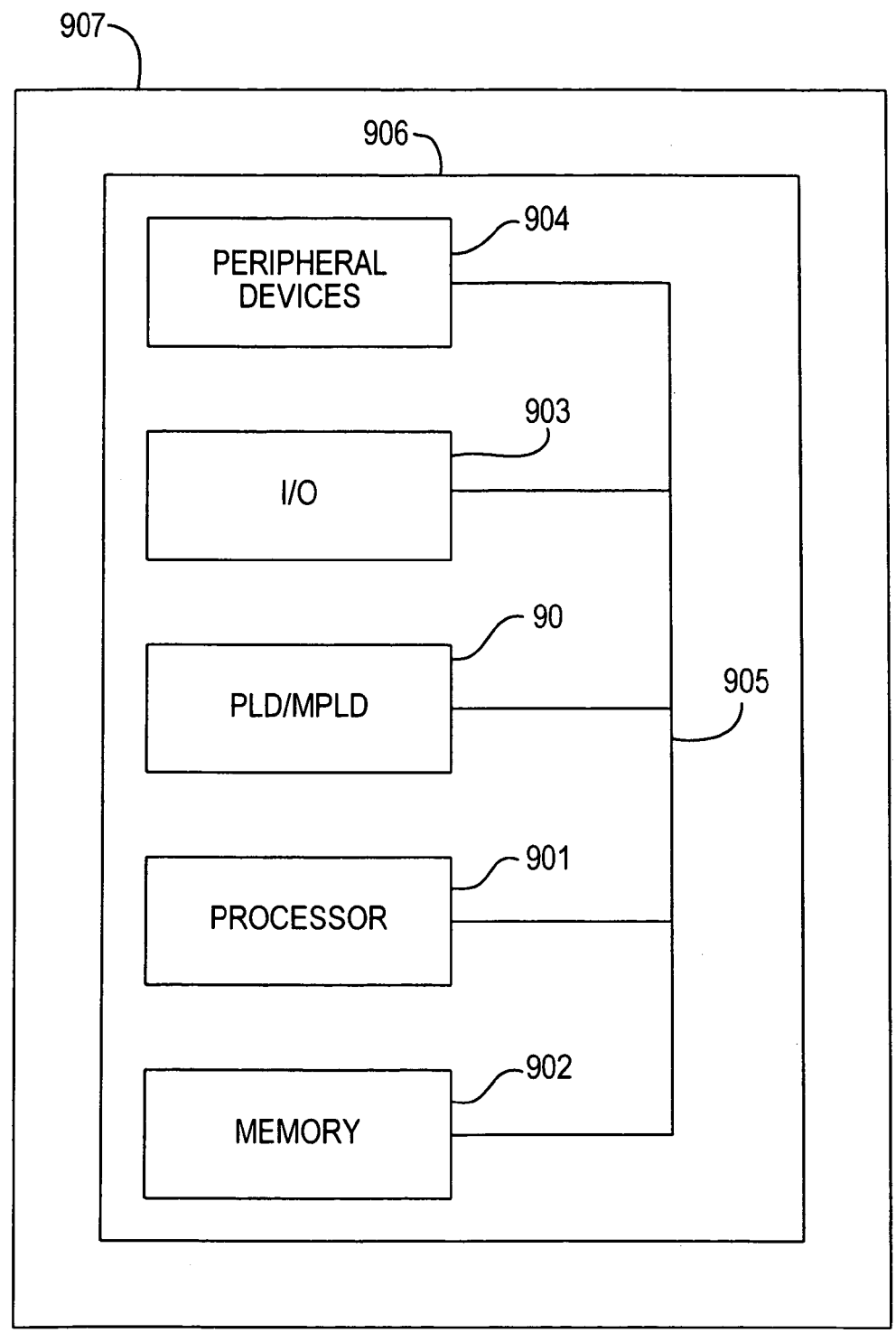
FIG. 5 is a simplified block diagram of an illustrative system employing a programmable logic device programmed using the present invention.

A programmable logic device or mask-programmable logic device (PLD or MPLD) 90 programmed according to the present invention may be used in many kinds of electronic devices. One possible use is in a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD/MPLD 90 can be used to perform a variety of different logic functions. For example, PLD/MPLD 90 can be configured as a processor or controller that works in cooperation with processor 901. PLD/MPLD 90 may also be used as an arbiter for arbitrating access to a shared resources in system 900. In yet another example, PLD/MPLD 90 can be configured as an interface between processor 901 and one of the other components in system 900. It should be noted that system 900 is only exemplary, and that the true scope and spirit of the invention should be indicated by the following claims.

Various technologies can be used to implement PLDs/MPLDs 90 as described above for programming according to this invention.

Figure 6:
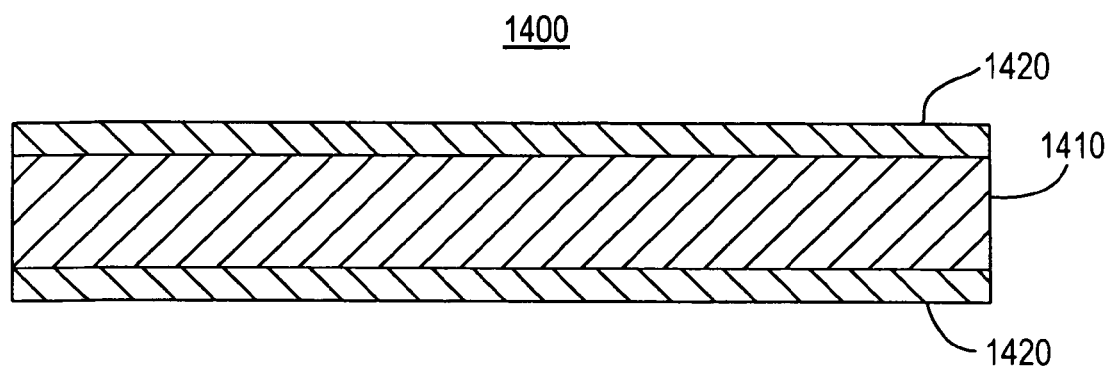
FIG. 6 is a cross-sectional view of a magnetic data storage medium encoded with a set of machine-executable instructions for performing the method according to the present invention.

FIG. 6 presents a cross section of a magnetic data storage medium 1400 which can be encoded with a machine executable program that can be carried out by systems such as system 20 of FIG. 2 to implement a method according to the invention such as method 10 of FIG. 1. Medium 1400 can be a floppy diskette or hard disk, having a suitable substrate 1410, which may be conventional, and a suitable coating 1420, which may be conventional, on one or both sides, containing magnetic domains (not visible) whose polarity or orientation can be altered magnetically. Medium 1400 may also have an opening (not shown) for receiving the spindle of a disk drive or other data storage device.

The magnetic domains of coating 1420 of medium 1400 are polarized or oriented so as to encode, in manner which may be conventional, a machine-executable program such as that described above in connection with FIG. 1, for execution by systems such as system 20 of FIG. 2.

Figure 7:
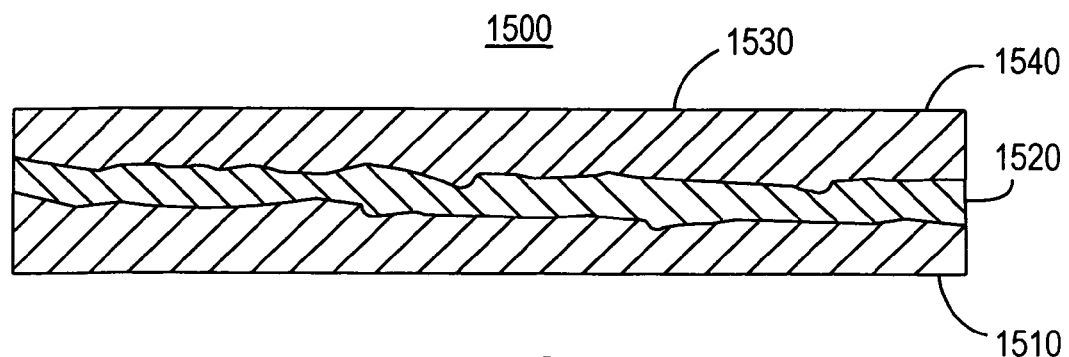
FIG. 7 is a cross-sectional view of an optically readable data storage medium encoded with a set of machine executable instructions for performing the method according to the present invention.

FIG. 7 shows a cross section of an optically-readable data storage medium 1500 which also can be encoded with such a machine-executable program, which can be carried out by systems such as system 20 of FIG. 2. Medium 1500 can be a conventional compact disk read only memory (CD-ROM) or digital video disk read only memory (DVD-ROM) or a rewriteable medium such as a CD-R, CD-RW, DVD-R, DVD-RW or DVD-RAM or a magneto-optical disk which is optically readable and magneto-optically rewriteable. Medium 1500 preferably has a suitable substrate 1501, which may be conventional, and a suitable coating 1502, which may be conventional, usually on one or both sides of substrate 1510.

In the case of a CD-based or DVD-based medium, as is well known, coating 1520 is reflective and is impressed with a plurality of pits 1530, arranged on one or more lasers, to encode the machine-executable program. The arrangement of pits is read by reflecting laser light off the surface of coating 1520. A protective coating 1540, which preferably is substantially transparent, is provided on top of coating 1502.

In the case of magneto-optical disk, as is well known, coating 1520 has no pits 1530, but has a plurality of magnetic domains whose polarity or orientation can be changed magnetically when heated above a certain temperature, as by a laser (not shown). The orientation of the domains can be read by measuring the polarization of laser light reflected from coating 1520. The arrangement of the domains encodes the program as described above.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method for comparing an origin programmable logic device user configuration dataset for a first programmable logic device to a destination programmable logic device user configuration dataset for a second programmable logic device where said origin programmable logic device user configuration dataset is a revision of a first programmable logic device user configuration dataset and said first and destination programmable logic device user configuration datasets have similar functionality, for determining whether said destination programmable logic device user configuration dataset can be synchronized with said revision, said method comprising:

determining at least one element of said origin programmable logic device user configuration dataset that differs from an element of said destination programmable logic device user configuration dataset;

querying a database of features of said first and second programmable logic devices;

applying information regarding said features to said at least one element that differs; and displaying to a user at least one of (a) said at least one element of said destination programmable logic device user configuration dataset that differs from said origin programmable logic device user configuration dataset, and (b) any elements of said destination programmable logic device user configuration dataset that do not differ from said origin programmable logic device user configuration dataset.

2. The method of claim 1 wherein said displaying further comprises displaying to said user any element of said destination programmable logic device user configuration dataset that, based on said information, cannot be changed.

3. The method of claim 1 wherein said displaying further comprises displaying to said user any element of said destination programmable logic device user configuration dataset that, based on said information, must be changed.

4. The method of claim 1 wherein said displaying comprises displaying on a graphical user interface.

5. The method of claim 4 further comprising changing said at least one element of said destination programmable logic device user configuration dataset that differs from said origin programmable logic device user configuration dataset.

6. The method of claim 5 wherein said changing comprises changing automatically.

7. The method of claim 5 wherein said changing comprises accepting user input to direct said changing.

8. The method of claim 7 wherein said accepting user input comprises accepting dragging and dropping of said at least one element in said graphical user interface.

9. The method of claim 7 wherein said changing comprises suggesting a change to said user prior to said accepting user input.

10. The method of claim 7 wherein said changing comprises requesting user input prior to said accepting user input.

11. The method of claim 1 further comprising changing said at least one element of said destination programmable logic device user configuration dataset that differs from said origin programmable logic device user configuration dataset.

12. The method of claim 11 wherein said changing comprises changing automatically.

13. The method of claim 11 wherein said changing comprises accepting user input to direct said changing.

14. The method of claim 13 wherein said accepting user input comprises accepting dragging and dropping of said at least one element in a graphical user interface.

15. The method of claim 13 wherein said changing comprises suggesting a change to said user prior to said accepting user input.

16. The method of claim 13 wherein said changing comprises requesting user input prior to said accepting user input.

17. Apparatus for comparing an origin programmable logic device user configuration dataset for a first programmable logic device to a destination programmable logic device user configuration dataset for a second programmable logic device where said origin programmable logic device user configuration dataset is a revision of a first programmable logic device user configuration dataset and said first and destination programmable logic device user configuration datasets have similar functionality, for determining whether said destination programmable logic device user configuration dataset can be synchronized with said revision, said apparatus comprising:

a storage device to store a database of features of said first and second programmable logic devices;

a processor to determine at least one element of said origin programmable logic device user configuration dataset that differs from elements of said destination programmable logic device user configuration dataset, to query said database of features of said first and second programmable logic devices, and to apply information regarding said features to determine which said at least one element differs from said origin programmable logic device user configuration dataset; and a display to display to a user at least one of (a) said at least one element of said destination programmable logic device user configuration dataset that differs from said origin programmable logic device user configuration dataset, and (b) elements of said destination programmable logic device user configuration dataset that do not differ from said origin programmable logic device user configuration dataset.

18. The apparatus of claim 17 wherein said display further displays to said user any element of said destination programmable logic device user configuration dataset that, based on said information, cannot be changed.

19. The apparatus of claim 17 wherein said display further displays to said user any element of said destination programmable logic device user configuration dataset that, based on said information, must be changed.

20. The apparatus of claim 17 further comprising a graphical user interface.

21. The apparatus of claim 20 wherein said processor further changes said at least one element of said destination programmable logic device user configuration dataset that differs from said origin programmable logic device user configuration dataset.

22. The apparatus of claim 21 wherein said processor changes said at least one element automatically.

23. The apparatus of claim 21 wherein said processor accepts user input to direct said changing.

24. The apparatus of claim 23 wherein said processor accepts, as said user input, dragging and dropping of said at least one element in said graphical user interface.

25. The apparatus of claim 23 wherein said processor suggests a change to said user prior to said accepting user input.

26. The apparatus of claim 23 wherein said processor requests user input prior to said accepting user input.

27. The apparatus of claim 17 wherein said processor further changes said at least one element of said destination programmable logic device user configuration dataset that differs from said origin programmable logic device user configuration dataset.

28. The apparatus of claim 27 wherein said processor changes said at least one element automatically.

29. The apparatus of claim 27 wherein said processor accepts user input to direct said changing.

30. The apparatus of claim 29 further comprising a graphical user interface; wherein:

said processor accepts, as said user input, dragging and dropping of said at least one element in said graphical user interface.

31. The apparatus of claim 29 wherein said processor suggests a change to said user prior to said accepting user input.

32. The apparatus of claim 29 wherein said processor requests user input prior to said accepting user input.

33. A machine-readable data storage medium encoded with a set of machine-executable instructions for using a data processing system to perform a method for comparing an origin programmable logic device user configuration dataset for a first programmable logic device to a destination programmable logic device user configuration dataset for a second programmable logic device where said origin programmable logic device user configuration dataset is a revision of a first programmable logic device user configuration dataset and said first and destination programmable logic device user configuration datasets have similar functionality, for determining whether said destination programmable logic device user configuration dataset can be synchronized with said revision, said method comprising:

determining at least one element of said origin programmable logic device user configuration dataset that differs from an element of said destination programmable logic device user configuration dataset;

querying a database of features of said first and second programmable logic devices;

applying information regarding said features to said at least one element that differs; and displaying to a user at least one of (a) said at least one element of said destination programmable logic device user configuration dataset that differs from said origin programmable logic device user configuration dataset, and (b) any elements of said destination programmable logic device user configuration dataset that do not differ from said origin programmable logic device user configuration dataset.

34. The machine-readable data storage medium of claim 33 wherein said data storage medium is magnetic.

35. The magnetic machine-readable data storage medium of claim 34, where said data storage medium is a floppy diskette.

36. The magnetic machine-readable data storage medium of claim 33 wherein said data storage medium is a hard disk.

37. The machine-readable data storage medium of claims 33 wherein said data storage medium is optically readable.

38. The optically readable data storage medium of claim 37 wherein said data storage medium is one of (a) a CD-ROM, (b) a CD-R, (c) a CD-RW, (d) a DVD-ROM, (e) a DVD-R, (f) DVD-RW, and (g) a DVD-RAM.

39. The optically readable data storage medium of claim 37 wherein said data storage medium is a magneto-optical disk.

* * * * *